(12) United States Patent
Higuchi

(10) Patent No.: US 6,240,036 B1
(45) Date of Patent: May 29, 2001

(54) VOLTAGE SUPPLY CIRCUIT IN A SEMICONDUCTOR MEMORY DEVICE

(75) Inventor: Tsutomu Higuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/519,574

(22) Filed: Mar. 6, 2000

(30) Foreign Application Priority Data

Mar. 26, 1999 (JP) .................................................. 10-084041

(51) Int. Cl.[7] ....................................................... G11C 8/00
(52) U.S. Cl. ..................... 365/226; 365/205; 365/230.03; 365/196
(58) Field of Search ............................... 365/226, 230.01, 365/230.03, 196

(56) References Cited

U.S. PATENT DOCUMENTS

| | | | |
|---|---|---|---|
| 5,875,145 | * | 2/1999 | Yamasaki et al. ................ 365/226 |
| 5,917,765 | * | 6/1999 | Morishita et al. ................ 365/201 |
| 5,956,278 | * | 9/1999 | Itou ...................................... 365/201 |
| 5,963,475 | * | 10/1999 | Choi et al. ........................ 365/185.11 |
| 5,966,341 | * | 10/1999 | Takahashi et al. .............. 365/230.03 |
| 6,104,641 | * | 8/2000 | Itou ................................. 365/189.01 |

FOREIGN PATENT DOCUMENTS

410199241 * 7/1998 (JP) .

* cited by examiner

Primary Examiner—Viet Q. Nguyen
(74) Attorney, Agent, or Firm—Jones Volentine, LLC

(57) ABSTRACT

A voltage supply circuit supplies an operational voltage to plural sense amplifier arrays and includes a plurality of MOS transistors. Each transistor is located between a power supply and one sense amplifier array. A stable operational voltage is supplied to the sense amplifier circuits in each sense amplifier array, whereby a high speed operation is realized.

8 Claims, 7 Drawing Sheets

VOLTAGE SUPPLY CIRCUIT IN A SEMICONDUCTOR MEMORY DEVICE

FIELD OF THE INVENTION

The present invention relates to a voltage supply circuit which supplies an operational voltage to sense amplifiers in a semiconductor memory device.

BACKGROUND OF THE INVENTION

Memory cell arrays MCA1 . . . MCAm, sense amplifier arrays SAA1 . . . SAAm and a voltage supply circuit 600 are shown in FIG. 7.

A memory cell array MCAi ($1 \leq i \leq m$) includes a plurality of memory cells and a plurality of bit line pairs. Each A bit line pair is connected to a memory cell and is provided with a data stored in the memory cell.

A sense amplifier array SAAi includes a plurality of sense amplifier circuits. Each sense amplifier circuit is connected to one of the bit line pairs in the MCAi and amplifies a voltage difference between the bit line pair.

The voltage supply circuit 600 supplies an operational voltage for the sense amplifier circuits in the sense amplifier arrays SAA1 . . . SAAm. The voltage supply circuit 600 is comprised of an operational amplifier circuit 601 and a p-channel type MOS transistor 603. An output terminal of the operational amplifier 601 is connected to a gate electrode of the MOS transistor 603. A source of the MOS transistor 603 is connected to a node which receives a power supply voltage from an outside power supply. A drain of the MOS transistor 603 is connected to conductive lines. Each conductive line is located in one of the sense amplifier arrays and is connected to the sense amplifier circuits for supplying the operational voltage.

A first input terminal of the operational amplifier circuit 601 is connected to a reference voltage Vr which is a substantially constant voltage and a second input terminal is connected to the drain of the MOS transistor 603.

In the semiconductor memory device mentioned above, if a voltage on the drain of the MOS transistor 603 becomes lower than the reference voltage Vr because of a current consumption in the sense amplifier array, the MOS transistor 603 turns on in response to a control signal which is provided from the output terminal of the operational amplifier 601. Then, the voltage on the drain is raised.

On the contrary, if a voltage on the drain of the MOS transistor 603 becomes higher than the reference voltage Vr, the MOS transistor 603 turns off in response to the control signal. Then, the voltage on the drain gradually falls because of the current consumption in the sense amplifier array. If the voltage becomes lower than the reference voltage Vr, the operation mentioned above is repeated.

Therefore, the voltage on the drain of the MOS transistor 603, that is the voltage on the conductive lines which supply the operational voltage to the sense amplifier circuits, is regularly maintained.

However, as the drain of the MOS transistor 603 is connected to a large number of sense amplifier arrays (the conductive lines), an undesirable delay can occur between sense amplifier arrays which are located in the vicinity of the drain and sense amplifier arrays which are located distant from the drain. This delay is caused by parasitic resisters, parasitic capacitors and the current consumption in the sense amplifier arrays.

This delay is undesirable in that it adversely influences a high speed operation in the semiconductor memory device. Particularly, in a dynamic random access memory which requires the highest speed, such delays may be a serious problem.

SUMMARY OF THE INVENTION

The object of the invention is to provide a semiconductor memory device which is capable of reducing a delay between a voltage supply circuit and a plurality of sense amplifier arrays.

To achieve the object, according to one aspect of the invention, a voltage supply circuit includes a plurality of MOS transistors, where each transistor is located between a power supply and one sense amplifier array.

According to another aspect of the invention, a voltage supply circuit is connected to one end of a conductive line which crosses a sense amplifier array and supplies an operational voltage to sense amplifier circuits therein, and the voltage supply circuit is connected to a reference voltage and a voltage on another end of the conductive line.

According to the present invention, it is possible to supply a stable operational voltage to the sense amplifier circuits in each sense amplifier array. A high speed operation can thus be realized.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, one embodiment is shown in which the present invention is applied to a DRAM (Dynamic Random Access Memory).

Figure 1:
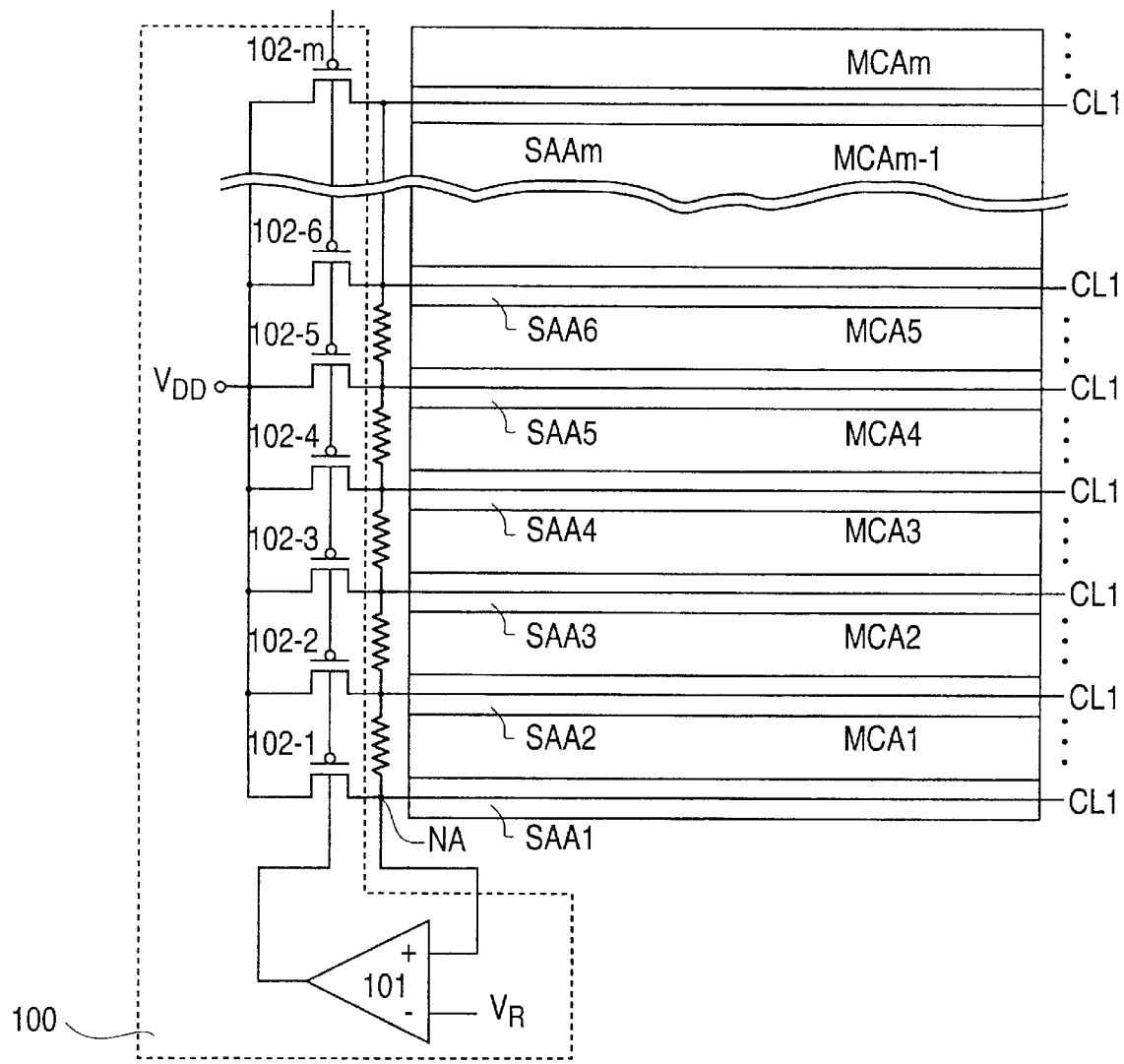
FIG. 1 is a circuit diagram partially illustrating a semiconductor memory device according to a first preferred embodiment of the present invention.

FIG. 1 is a partial circuit diagram of a semiconductor memory device (DRAM) according to a first preferred embodiment.

The semiconductor memory device is comprised of a plurality of memory cell arrays MCA1 . . . MCAm and a plurality of sense amplifier arrays SAA1 . . . SAAm. The memory cell arrays MCAi (1≦i≦m) and the sense amplifier arrays SAAI (1≦i≦m) are alternately arranged as shown in FIG. 1.

Figure 2:
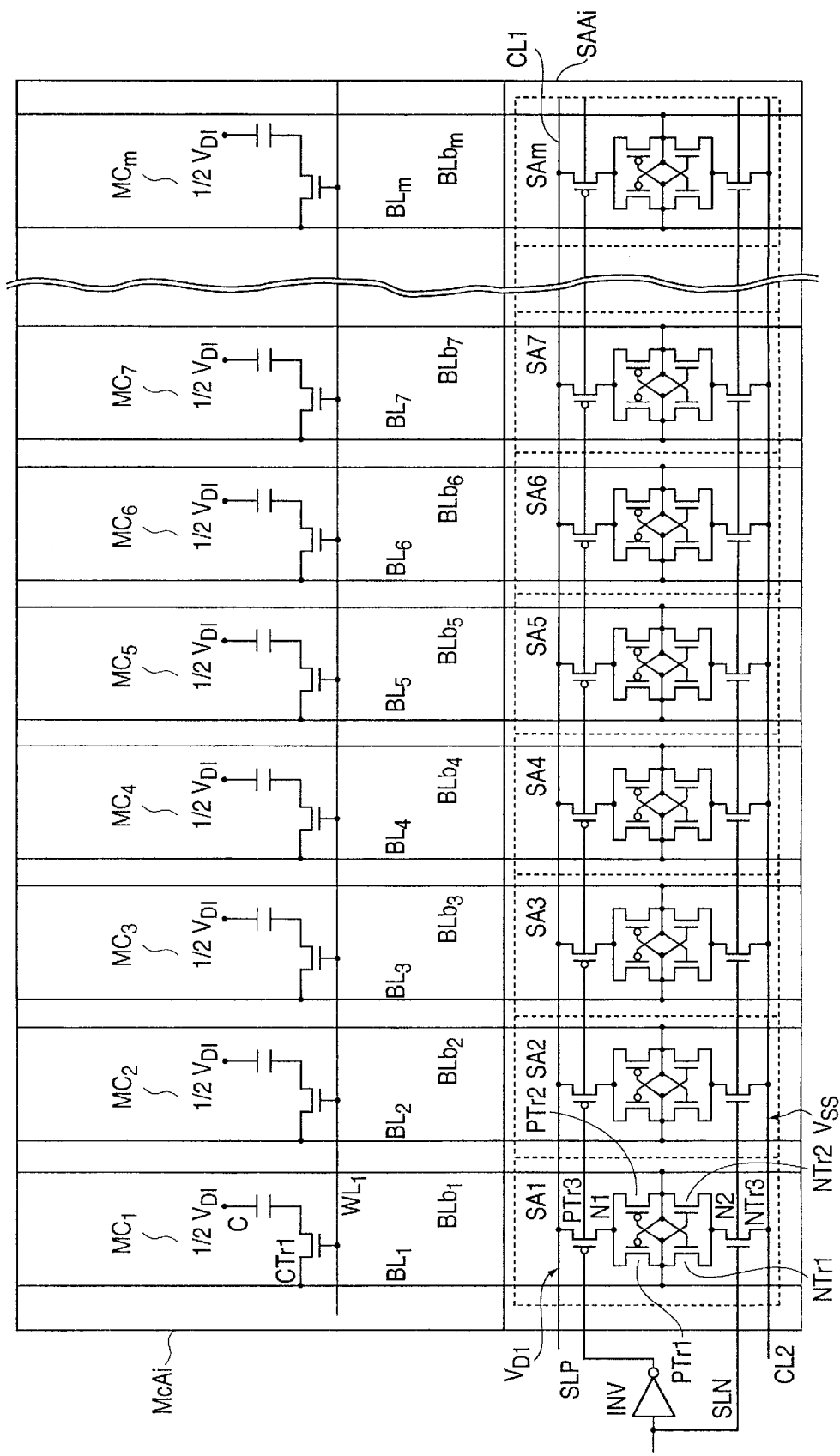
FIG. 2 is a circuit diagram of an operational amplifier circuit according to the first preferred embodiment.

A partial circuit diagram of one of the memory cell arrays and the sense amplifier arrays is shown in FIG.2.

A memory cell array MCAi comprises a plurality of memory cells MC1 . . . MCm to store data, bit line pairs BL1, BLb1 . . . BLm, BLbm for connecting to each of the memory cells, and word lines WL1 . . . WLm for selecting memory cells.

The memory cell MC is formed of an enhancement type N channel MOS transistor (hereinafter referred to as NMOS) CTr1 and a capacitor C. The gate electrode of the CTr1 is connected to the word line WL, the drain electrode of the NTr1 is connected to the bit line BL, and the source electrode of the CTr1 is connected to the capacitor C. The capacitor C is connected between the source electrode of the CTr1 and a reference voltage 1/2 VDI. The reference voltage 1/2VDI is half the voltage of an operational voltage VDI described after.

The sense amplifier array SAAi comprises a plurality of sense amplifier circuit SA1 . . . SAm. Each sense amplifier circuit SA includes enhancement type P channel MOS transistors (hereinafter referred to as PMOS) PTr1, PTr2 and NMOSs NTr1, NTr2.

The gate electrode of the PMOS PTr1 is connected to the bit line BLb, the drain electrode of the PMOS PTr1 is connected to the bit line BL, and the source electrode of the PMOS PTr1 is connected to a first conductive line CL1 which supplies an operational voltage VDI for an operation of the sense amplifier circuits through a PMOS PTr3. A gate electrode of the PMOS PTr3 is connected to a sense amplifier activating signal supply line SLP.

The gate electrode of the PMOS PTr2 is connected to the bit line BL, the drain electrode of the PMOS PTr2 is connected to the bit line BLb, and the source electrode of the PMOS PTr2 is connected to the first conductive line CL1 through a PMOS PTr3.

The gate electrode of the NMOS NTrl is connected to the bit line BLb, the drain electrode of the NMOS NTr2 is connected to the bit line BL, and the source electrode of the NMOS NTr2 is connected to a second conductive line CL2 which supplies an operational voltage Vss for an operation of the sense amplifier circuits through an NMOS NTr3. A gate electrode of the NMOS NTr3 is connected to a sense amplifier activating signal supply line SLN. The operational voltage Vss is a standard voltage, such as ground voltage.

The gate electrode of the NMOS NTr2 is connected to the bit line BL, the drain electrode of the NMOS NTr2 is connected to the bit line BLb, and the source electrode of the NMOS NTr2 is connected to the second conductive line through the NMOS NTr3.

The sense amplifier activating signal supply line SLP and the sense amplifier activating signal supply line SLN are supplied with a sense amplifier control signal during a sensing period. The sense amplifier circuits amplify the voltage difference between complementary bit line pairs during the sensing period (operational period of a sense amplifier) in response to the sense amplifier control signal. An inverter INV is arranged between the line SLP and the line SLN. That is, complementary signals are provided to the lines SLP, SLN, respectively.

The first conductive line CL1 crosses the sense amplifier array shown in FIG. 1 and FIG. 2. The first conductive line CL1 supplies the operational voltage VDI with the sense amplifier circuits in one sense amplifier array.

A voltage supply circuit 100 is located between the first conductive lines CL1 and a power supply line which is provided with a power supply voltage.

The power supply having the power supply voltage VDD and a ground having a ground voltage Vss are applied from outside the memory device shown in FIG. 1, and these voltages are used to drive the elements in this memory device. Although the power supply voltage VDD is used to drive the elements in this memory device, it is also known to drive the elements by configuring an internal power supply circuit in this memory device and supplying an internal power supply voltage from the power supply circuit. In place of the power supply voltage described in this embodiment, the internal power supply voltage can be used. However, since such substitution can be understood with reference to the following description, the description thereof will herein be omitted.

In this preferred embodiment, the power supply voltage VDD is a voltage of "2V".

The voltage supply circuit 100 is comprised of an operational amplifier 101 and a plurality of PMOS transistors 102-1 . . . 102-m. Each PMOS transistor is arranged between the conductive line CL1 in each sense amplifier array and the power supply line.

Gate electrodes of the PMOS transistors 102-1 . . . 102-m are connected to an output terminal of the operational amplifier 101. A first input terminal of the operational amplifier 101 is provided with a reference voltage Vr. A second input terminal of the operational amplifier 101 is connected to the drains of the PMOS transistors 102-1 . . . 102-m. That is, the first conductive lines CL1 are connected to the second input terminal and the operational voltage VDI is provided to the second input terminal. The connection point between the second input terminal and the first conductive line CL1 is a node NA. In this preferred embodiment, the operational voltage VDI is a voltage of "2V" and the reference voltage is a voltage of "1V".

Figure 3:
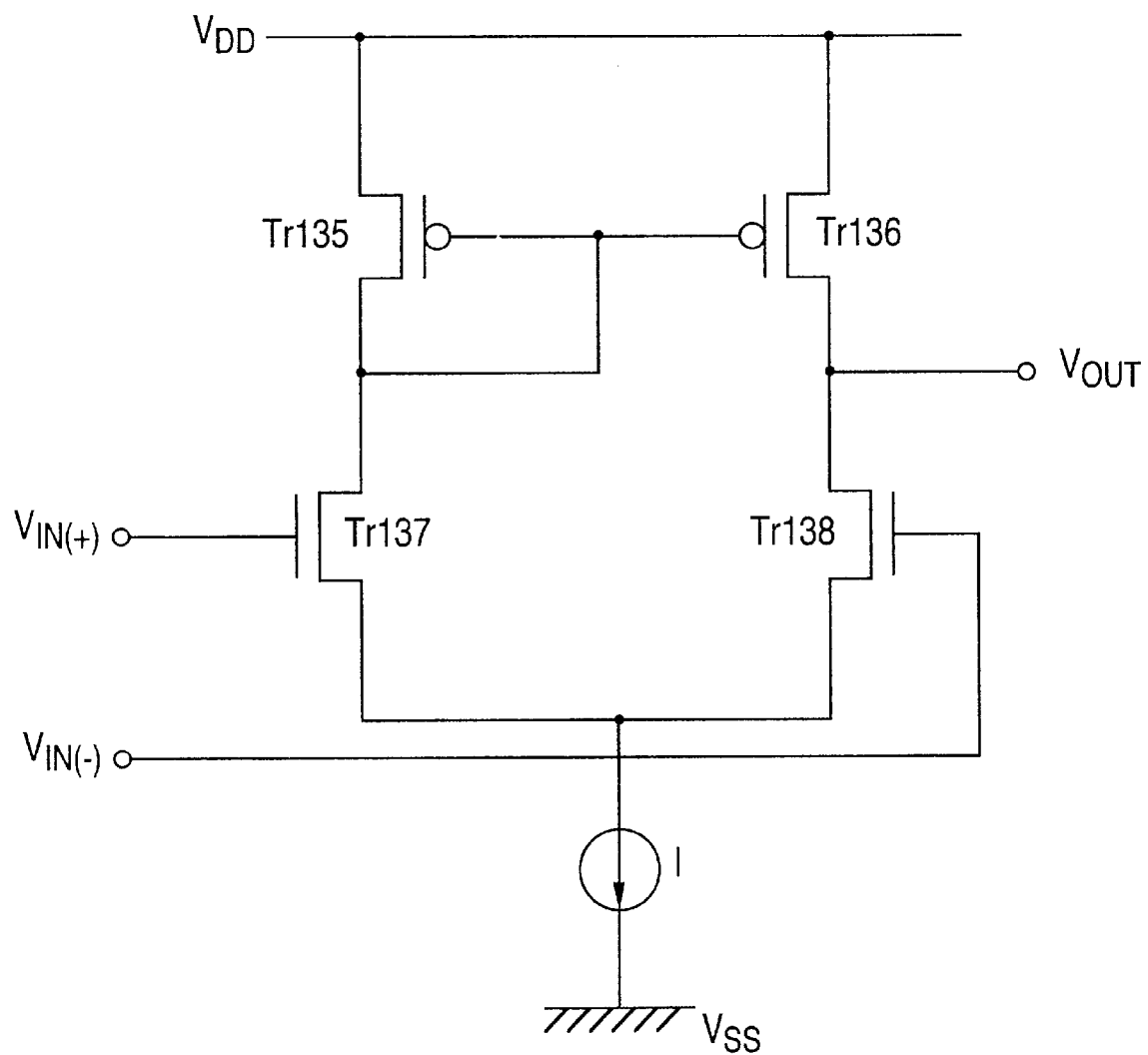
FIG. 3 is a circuit diagram of a memory cell array and a sense amplifier array according to the first preferred embodiment.

A circuit diagram of the operational circuit 101 is shown in FIG.3. The operational circuit is comprised of PMOS transistors Tr135 and Tr136, NMOS transistors Tr137 and Tr138 and a current source I. Drains of the PMOS transistors Tr135 and Tr136 are connected to the power line, and sources of the PMOS transistors Tr135 and Tr136 are connected to drains of the NMOS transistors Tr137 and Tr138. Sources of the NMOS transistors Tr137 and Tr138 are connected to the current source I. Another end of the current source I is connected to the ground Vss). Gates of the PMOS transistors Tr135 and Tr136 are connected to the source of the PMOS transistor Tr135. A gate of the NMOS transistor Tr137 is the second input terminal VIN(+) and is connected to the drains of the PMOS transistors Tr102-1 . . . Tr102-m. A gate of the NMOS transistor Tr138 is the first input terminal VIN(−) and is provided with the reference voltage Vr. A connection between the source of PMOS transistor Tr136 and the drain of NMOS transistor Tr138 is the output terminal Vout of the operational amplifier 101. The output terminal Vout is connected to the gates of the PMOS transistors 102-1 . . . 102-m. The operational amplifier controls a switching operation of the PMOS transistors 102-1 . . . 102-m in response to the reference voltage Vr and a voltages of the drains of the PMOS transistors Tr102-1 . . . Tr102-m.

Figure 4:
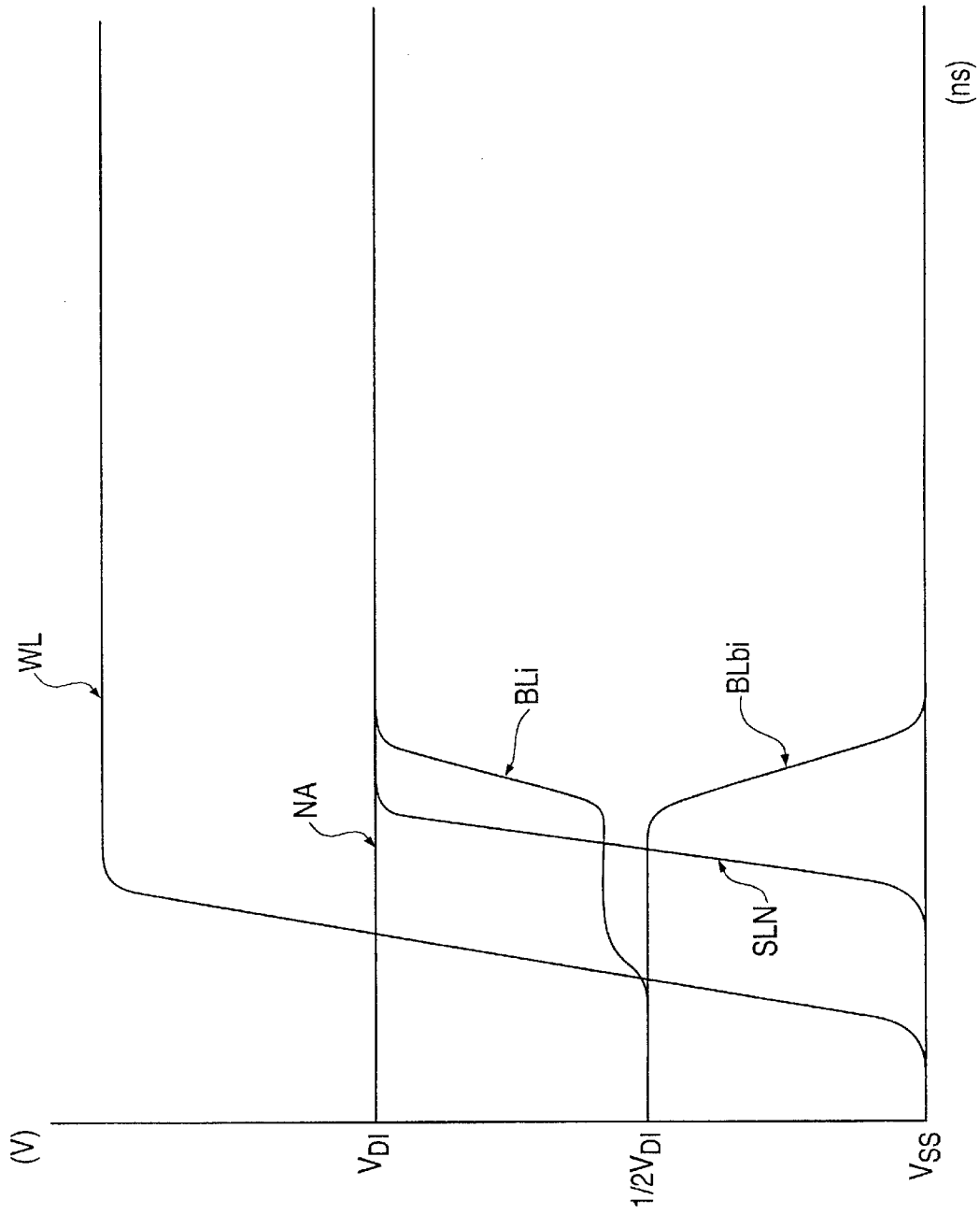
FIG. 4 is a timing chart illustrating an outline of operation according to the first preferred embodiment.

Here, an outline of overall operation of the semiconductor memory device according to the first preferred embodiment will be described with reference to the timing chart shown in FIG.4. In the following case, only a data readout operation is described. A data write operation will be easily understood by persons skilled in the art with reference to the following description of the read operation.

First, when a voltage of the word line WL becomes "H"(high level), the data stored in a memory cell connected to the WL appears in a voltage variation of the bit line pair BLi, BLbi.

Next, when the sense amplifier control signal SLN (SLP) is supplied, the sense amplifier circuits in the sense amplifier array are activated. As the sense amplifier control signal SLN is "H" which has a voltage of the operational voltage VDI and the sense amplifier control signal SLP is "L" which has a voltage of the ground voltage Vss, the PMOS transistor PTr3 and the NMOS transistor NTr3 turn on. Then the voltage difference of the bit line pair Bli, BLbi is amplified, a voltage of the bit line Bli becomes the operational voltage VDI and a voltage of the bit line BLbi becomes the ground voltage Vss. A through current flows from the operational voltage to the ground during a sensing period.

In the semiconductor memory device according to the first preferred embodiment, if a voltage on the node NA becomes lower than the reference voltage Vr because of a current consumption in the sense amplifier array, a voltage of the output signal from the operational amplifier 101 changes from the operational voltage VDI to the ground voltage Vss. Then, the PMOS transistor 102-1 . . . 102-m turn on. So, the power supply voltage Vdd from the power supply line is provided to the first conductive lines CL1. Therefore, the voltage of the node NA is raised.

Then, if the voltage on the node NA becomes higher than the reference voltage Vr because of the supply from the power supply line, the voltage of the output signal from the operational amplifier 101 changes from the ground voltage Vss to the operational voltage VDI. Then, the PMOS transistors 102-1 . . . 102-m turn off. So, the power supply voltage Vdd from the power supply line is stopped to provide to the first conductive lines CL1. Then, the voltage on the node NA gradually falls because of the current consumption in the sense amplifier array. If the voltage on the node NA becomes lower than the reference voltage Vr, the operation mentioned above is repeated.

Therefore, the voltage on the node NA, that is the voltage on the first conductive lines which supply the operational voltage VDI to the sense amplifier circuits, is maintained.

According to the first preferred embodiment, as the plurality of MOS transistors of the voltage supply circuit which supplies the operational voltage to the sense amplifier circuits in each sense amplifier array are position so as to correspond with the sense amplifier arrays, it is possible to supply a stable operational voltage to the sense amplifier circuits in each sense amplifier array. That is, despite the location of the sense amplifier arrays, it is possible to supply a uniform operational voltage to the sense amplifier arrays. The uniform operational voltage contributes to a high speed operation in the semiconductor memory device. Especially in a dynamic random access memory which is required to have a high operation, the advantageous effect is substantial.

Further, as the MOS transistors of the voltage supply circuit can be comprised of transistors which have a small gate width, it is possible to reduce an electro-migration problem.

Figure 5:
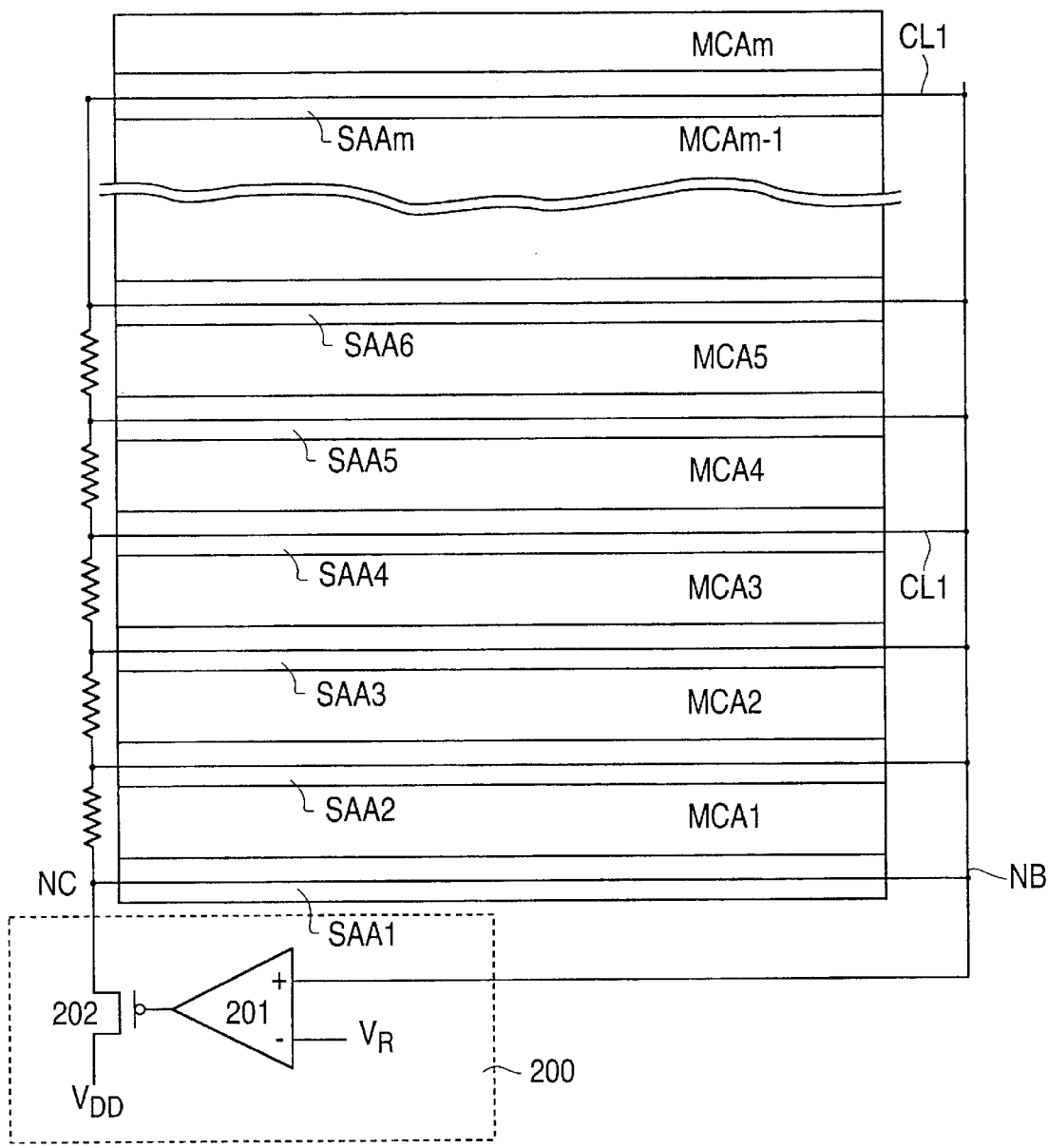
FIG. 5 is a circuit diagram according to a second preferred embodiment.

A voltage supply circuit 200 according to a second preferred embodiment is explained hereinafter, referring to FIG. 5. In this embodiment, the portions mentioned above are marked with the same symbols and a description of such portions is omitted below.

The voltage supply circuit 200 is comprised of an operational amplifier 201 and a PMOS transistor 202. The PMOS transistor 202 is arranged between the conductive line CL1 in each sense amplifier array and the power supply line.

A gate electrode of the PMOS transistors 202 is connected to an output terminal of the operational amplifier 201. A first input terminal of the operational amplifier 201 is provided with a reference voltage Vr. A second input terminal of the operational amplifier 201 is connected to the first conductive lines at a node NB. That is, one end (a node NC) of the conductive lines is connected to a drain of the PMOS transistor 202 and another end (the node NB) is connected to the second input terminal. The operational amplifier 202 generally corresponds to the operational amplifier 101 shown in FIG. 3.

An operation of the second embodiment will be easily understood by persons skilled in the art with reference to the foregoing description according to the first preferred embodiment.

In this embodiment, the operational amplifier 201 controls the PMOS transistor 202 based on the reference voltage Vr and the voltage on the node NB. In one first conductive line, the node NB is located at the place where it is most distant from the power supply line. That is, in one first conductive line, the voltage of the node NB becomes the lowest because of the current consumption by the number of sense amplifier circuits.

Therefore, the operational amplifier 201 controls PMOS transistor 202 in response to the reference voltage and a voltage of the lowest point in the conductive line which supplies the operational voltage to the sense amplifier circuits.

According to the second preferred embodiment, as the voltage supply circuit is responsive to the lowest voltage in the conductive line, it is possible to supply a stable operational voltage to the sense amplifier circuits in each sense amplifier array, compared with the first preferred embodiment. That is, it is possible to supply uniform operational voltage to the sense amplifier arrays. The uniform operational voltage contributes to a high speed operation in the semiconductor memory device. Especially in a dynamic random access memory which is required to have a high operation, the advantageous effect is substantial.

Figure 6:
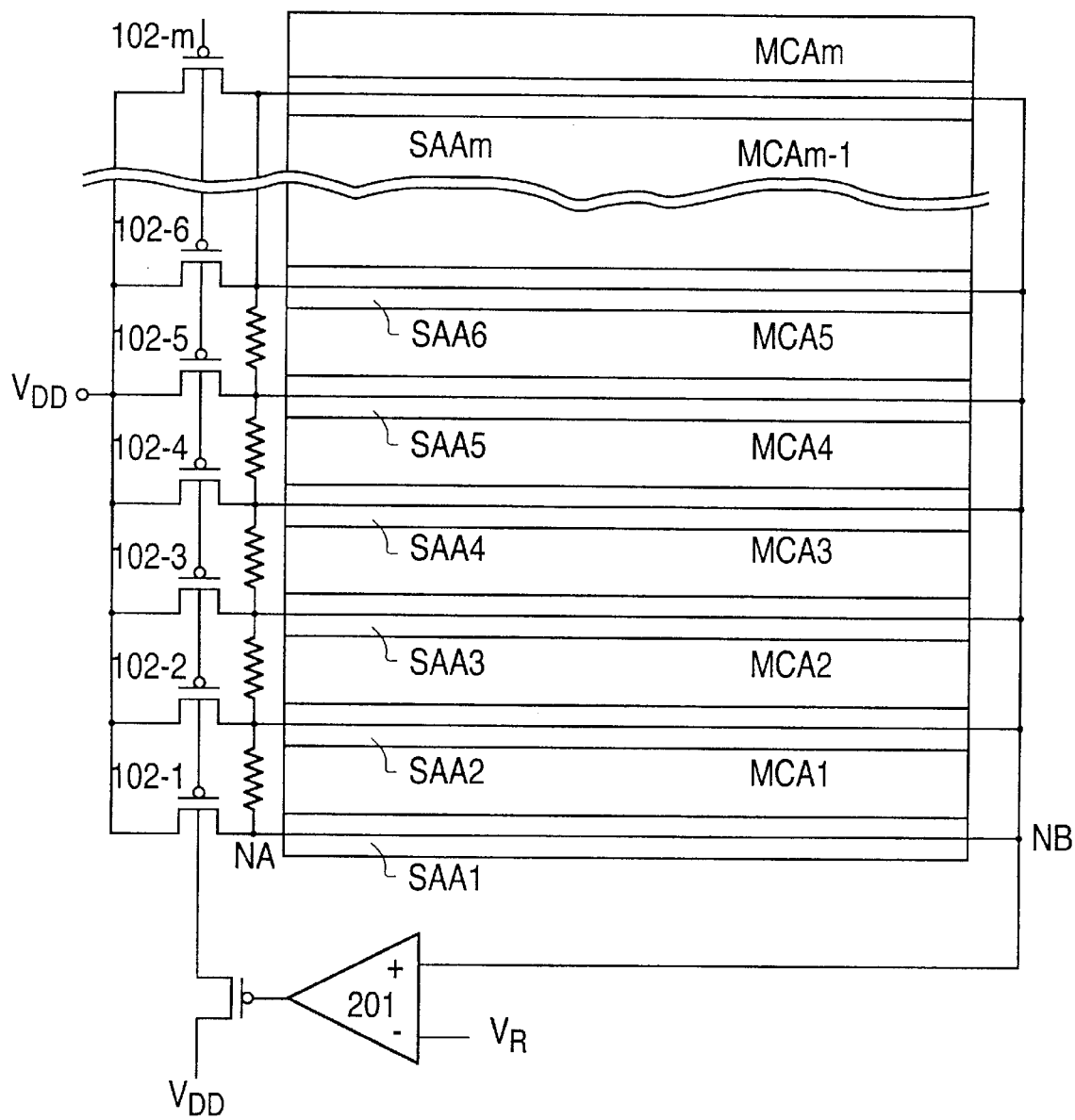
FIG. 6 is a circuit diagram according to a third preferred embodiment.
Figure 7:
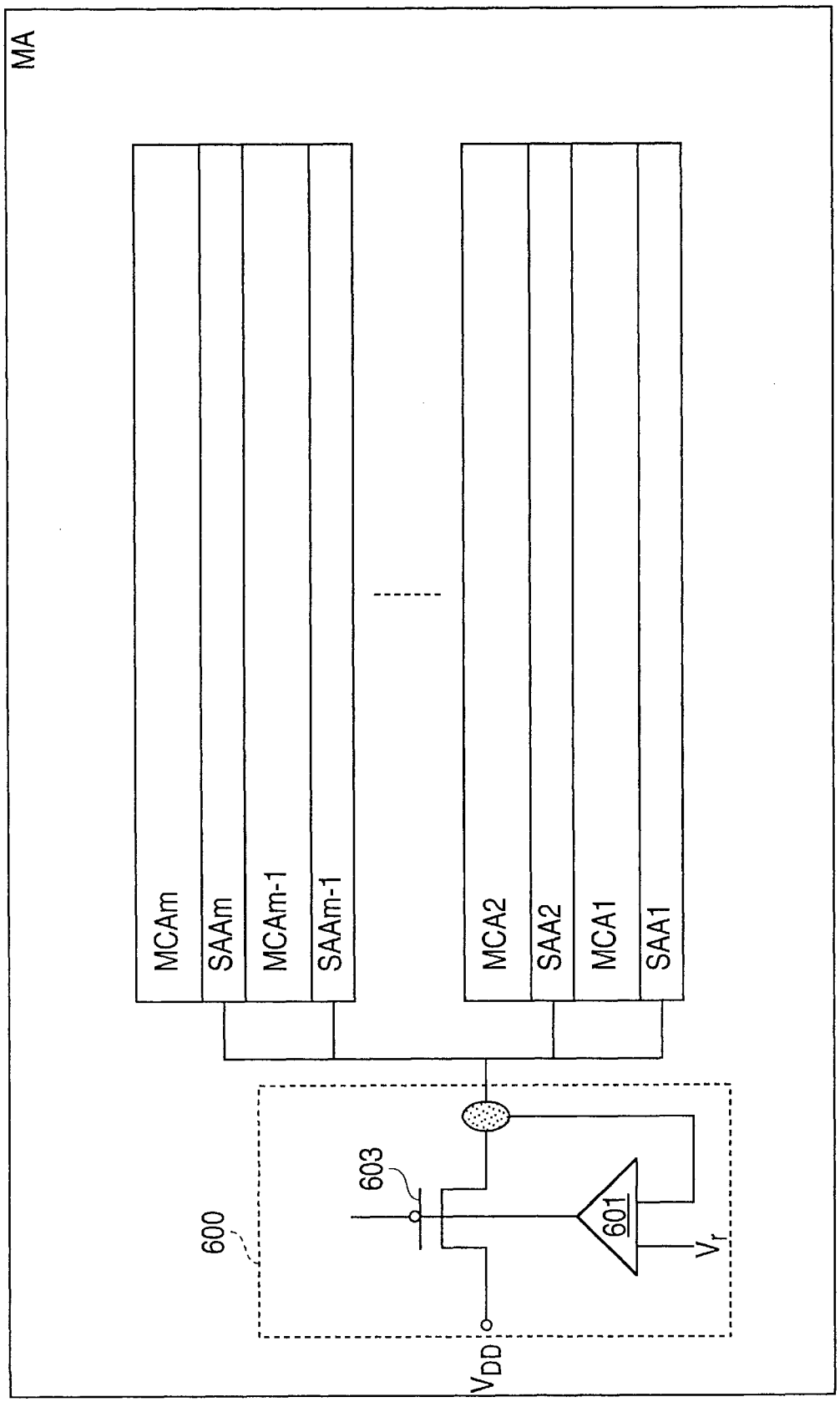
FIG. 7 is a circuit diagram according to a conventional voltage supply circuit.

A voltage supply circuit 300 according to a third preferred embodiment is explained hereinafter, referring to FIG. 6. In this embodiment, the portions mentioned above are marked with the same symbols and a description of such portions is omitted below.

The voltage supply circuit 300 is formed by a combination of the PMOS transistors 102-1 . . . 102-m of the first embodiment and the operational amplifier 201 of the second embodiment.

According to the third preferred embodiment, it is possible to supply a stable operational voltage to the sense amplifier circuits in each sense amplifier array, compared with the first preferred embodiment, and it is possible to reduce an electro-migration problem.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A semi conductor memory device comprising:
   a plurality of memory cell arrays, each memory cell array including a plurality of word lines, a plurality of p airs of bit lines, each including a first bit line and a second bit line intersecting the word lines, and a plurality of memory cells located at intersections of the word lines and the first bit lines, said memory cells storing data therein;
   a plurality of sense amplifier arrays which are respectively located between the memory cell arrays, each sense amplifier array including a plurality of sense amplifier circuits, each sense amplifier circuit connected to one of the pair of bit lines and setting a voltage of the first bit line to a first voltage and a voltage of the second bit line to a second voltage which is lower than the first voltage in response to a sense amplifier active signal during a sensing period;
   a power supply conductive layer which receives a power supply; and
   a voltage supply circuit which supplies the first voltage to the plurality of sense amplifier arrays, and which includes a plurality of MOS transistors and a control circuit which outputs a control signal and controls the plurality of MOS transistors, wherein each MOS transistor is arranged between the power supply conductive layer and one of the sense amplifiers, wherein each MOS transistor has a gate electrode which receives the control signal, and wherein the control circuit outputs the control signal in response to a reference voltage and a voltage of a connection point between the MOS transistor and the sense amplifier array.

2. The semiconductor memory device according to claim 1, further comprising a plurality of conductive lines, wherein each conductive line is arranged to cross each sense amplifier array, and wherein the voltage supply circuit supplies the first voltage to each sense amplifier array through the conductive line.

3. The semiconductor memory device according to claim 1, wherein each sense amplifier circuit includes a second MOS transistor having a gate electrode which receives the sense amplifier active signal, and wherein the second MOS transistor is connected to the one of the conductive lines.

4. A semiconductor memory device comprising:
   a memory cell array which includes a plurality of memory cells, each memory cell storing data therein;
   a sense amplifier array which is located along the memory cell array and includes a plurality of sense amplifier circuits, wherein each sense amplifier circuit is electrically connected to one of the memory cells and amplifies the data which is outputted from one of the memory cells;
   a conductive line which crosses the sense amplifier array and supplies a power supply voltage to the sense amplifier circuits;
   a power supply line which supplies the power supply voltage to the semiconductor memory; and
   a voltage supply circuit which includes a MOS transistor and a control circuit, wherein the MOS transistor is connected between the power supply line and one end of the conductive line and the control circuit is connected to another end of the conductive line, wherein the control circuit controls the MOS transistor in response to a voltage of the other end of the conductive line.

5. The semiconductor memory device according to claim 4, wherein the control circuit is comprised of a differential amplifier which has two input terminals and an output terminal, wherein one input terminal is connected to the other end and another input terminal receives a reference voltage, and wherein the output terminal is connected to a gate electrode of the MOS transistor.

6. The semiconductor memory device according to claim 4, wherein each sense amplifier circuit includes a second MOS transistor having a gate electrode which receives a sense amplifier active signal, wherein the second MOS transistor is connected to the conductive line.

7. A semiconductor memory device comprising:
   a plurality of memory cell arrays, each memory cell array including a plurality of word lines, a plurality of pairs of bit lines each including a first bit line and a second bit line intersecting the word lines, and a plurality of memory cells located at intersections of the word lines and the first bit lines, said memory cells storing data therein;
   a plurality of sense amplifier arrays which are respectively located between the memory cell arrays, each sense amplifier array including a plurality of sense amplifiers, each sense amplifier connected to one of the pair of bit lines and setting a voltage of the first bit line to a first voltage and a voltage of the second bit line to a second voltage which is lower than the first voltage in response to a sense amplifier active signal during a sensing period;
   a power supply line which supplies the first voltage;
   a plurality of conductive lines, wherein each conductive line crosses one of the sense amplifier arrays and supplies the first voltage to the sense amplifier circuits in the one of the sense amplifier arrays;
   a voltage supply circuit which includes a plurality of MOS transistors and a control circuit which outputs a control signal and controls the plurality of MOS transistors, wherein each MOS transistor is arranged between the power supply line and one end of one of the conductive lines, wherein each MOS transistor has a gate electrode which receives the control signal, wherein the control circuit outputs the control signal in response to a voltage of another end of the one of the conductive line.

8. The semiconductor memory device according to claim 7, wherein each sense amplifier circuit includes a second MOS transistor having a gate electrode which receives the sense amplifier active signal, and wherein the second MOS transistor is connected to the one of the conductive lines.

* * * * *